United States Patent [19]
Sakamoto

[11] Patent Number: 4,810,200
[45] Date of Patent: Mar. 7, 1989

[54] IC-PACK CONNECTOR APPARATUS HAVING EJECTING FUNCTION
[75] Inventor: Haruo Sakamoto, Tokyo, Japan
[73] Assignee: E. I. Du Pont de Nemours and Company, Wilmington, Del.
[21] Appl. No.: 194,313
[22] Filed: May 16, 1988
[30] Foreign Application Priority Data
May 18, 1987 [JP] Japan ............................ 62-74081[U]
[51] Int. Cl.$^4$ .......................................... H01R 13/62
[52] U.S. Cl. .................................. 439/155; 439/353; 439/328
[58] Field of Search ............... 439/297, 298, 310, 324, 439/347, 354, 358, 525, 68, 70, 152, 153, 155, 157, 159, 160, 353, 328

[56] References Cited
U.S. PATENT DOCUMENTS

| | | | |
|---|---|---|---|
| 2,464,413 | 3/1949 | Parsons | 439/160 |
| 3,150,906 | 9/1964 | Chandlon | 439/157 |
| 4,128,288 | 12/1978 | Zachry et al. | 439/152 |
| 4,466,680 | 8/1984 | Sakai et al. | 439/159 |
| 4,498,047 | 2/1985 | Hexamer | 439/152 |

FOREIGN PATENT DOCUMENTS 0116426  8/1984  European Pat. Off. ............ 439/160
2512193 10/1976  Fed. Rep. of Germany ...... 439/152

Primary Examiner—David Pirlot

[57] ABSTRACT

A connector apparatus comprises a header connector, into which an IC pack is loaded and from which it is unloaded, and an ejector unit detachably mounted on the header connector. The header connector includes a locking lever having a protrusion which is adapted to engage a locking notch in the surface of the IC pack, when the IC pack is loaded. The ejector unit includes a base attached to one surface of the heater connector, a push lever attached to one side portion of the base, so as to be movable in the loading or unloading direction of the IC pack, an unlocking lever formed integrally on the push lever and adapted to engage the locking lever, when the push lever moves in the pack-loading direction, and an eject member movably mounted on the base and having an eject portion adapted to move in the pack-unloading direction as the push lever moves in the pack-loading direction. When the push lever is moved in the pack-loading direction, the eject portion of the eject member moves while pushing out the IC pack, after the unlocking lever of the push lever causes the release of the locking lever of the header connector from the locking notch of the IC pack.

4 Claims, 3 Drawing Sheets

IC-PACK CONNECTOR APPARATUS HAVING EJECTING FUNCTION

BACKGROUND OF THE INVENTION

1. Field of the Invention

The present invention relates to a connector apparatus having a header connector adapted for use with an IC pack, such as a memory card, and, more particularly, to a connector apparatus having a function to eject an IC pack from the header connector.

2. Description of the Related Art

Conventionally known are header connectors for IC packs which are provided with various attachments, such as a locking member for preventing the undesired ejection of a loaded IC pack, an unlocking member for unlocking the IC pack, and/or an eject member for facilitating the removal of the IC pack for replacement.

Since they are permanently attached to the header connector, however, these members are subject to the following problems:

The header connector requires the use of the aforesaid various members, depending on the application. However, if the members are integral with the connector, as in the prior art arrangement described above, the connector must be selected corresponding to the way a header is used. If the use of the header is changed after the connector is once mounted on a circuit board, therefore, the connector itself must be replaced. Meanwhile, the header connector is treated with various chemicals when it is soldered to the circuit board. These chemicals may possibly damage the attached members or wash off lubricating oil thereon.

SUMMARY OF THE INVENTION

The object of the present invention is to provide a connector device in which a header connector of one type can be used for a variety of applications, and in which various members attached to the connector can be operated easily and with high efficiency.

A connector apparatus according to the present invention comprises a header connector, into which an IC pack is loaded and from which it is unloaded, and an ejector unit detachably mounted on the header connector, the header connector including a locking lever having a protrusion adapted to engage a locking notch in the surface of the IC pack, when the IC pack is loaded, and the ejector unit including a base attached to one surface of the header connector, a push lever attached to one side portion of the base, so as to be movable in the loading or unloading direction of the IC pack, an unlocking lever formed integrally on the push lever, and adapted to engage the locking lever when the push lever moves in the pack-loading direction, and an eject member movably mounted on the base, and having an eject portion adapted to move in the pack-unloading direction as the push lever moves in the pack-loading direction, wherein the eject portion of the eject member moves while pushing out the IC pack, after the unlocking lever of the push lever causes the protrusion of the locking lever of the header connector to move out of the locking notch of the IC pack, when the push lever is moved in the pack-loading direction.

In the connector device according to the present invention, as described above, the ejector unit, which is constructed independently of the header connector, can be detached from the header connector as required. Since the unlocking lever is formed integrally on the push lever, moreover, the IC pack, such as a memory card, can be unlocked and ejected simply by pushing in the push lever.

DETAILED DESCRIPTION OF THE PREFERRED EMBODIMENT

Figure 1:
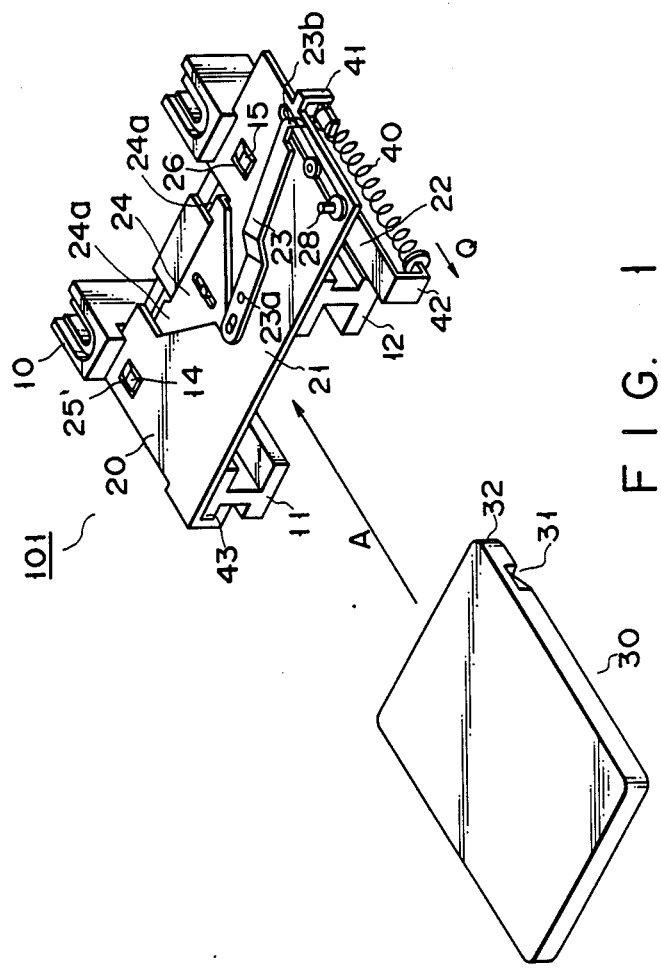
FIG. 1 is perspective view showing a connector device according to an embodiment of the present invention, and a memory card.

An illustrative embodiment of the present invention will now be described. Referring now to FIG. 1, there are shown a connector apparatus 101 according to the embodiment of the invention, and a memory card 30. The connector apparatus comprises header connector 10 and ejector unit 20 assembled to together. Card 30 is adapted to be inserted into the connector apparatus.

Figure 2:
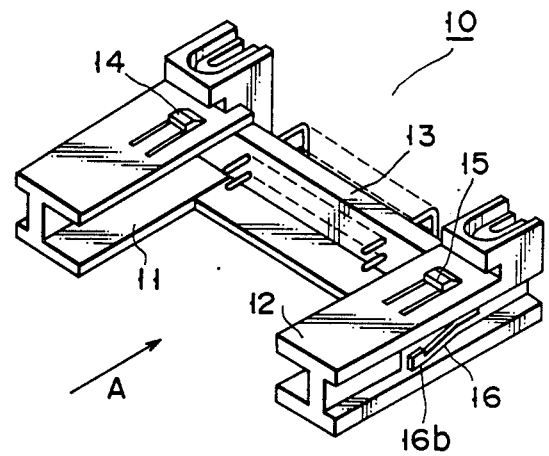
FIG. 2 is a perspective view of a header connector of the connector device of FIG. 1.

As is shown in FIG. 2, header connector 10 includes a pair of parallel arm sections, 11 and 12, and coupling section 13 connecting the arm sections. The memory card can be inserted between arm sections 11 and 12, in the direction indicated by arrow A. Projections 14 and 15 are formed on the upper surfaces of sections 11 and 12, respectively. The projections are used to fix the ejector unit on header connector 10, as will be described in detail later.

Locking lever 16 is attached to the lateral portion of arm section 12 of header connector 10. As is shown in the enlarged sectional plan view of FIG. 3, one end 16a of lever 16 is mounted on the header connector, while other end 16b extends outwardly from the connector. In addition, lever 16 is provided with protrusion 16c which projects inside the connector. Thus, if memory card 30, having locking notch 31, is loaded into the header connector, locking lever 16 starts to bend. After the card is set in position, as indicated by broken line in FIG. 2, lever 16 is restored to its original position. Thereupon, protrusion 16c of the lever is fitted into notch 31 of the card to be fixed therein.

Figure 4:
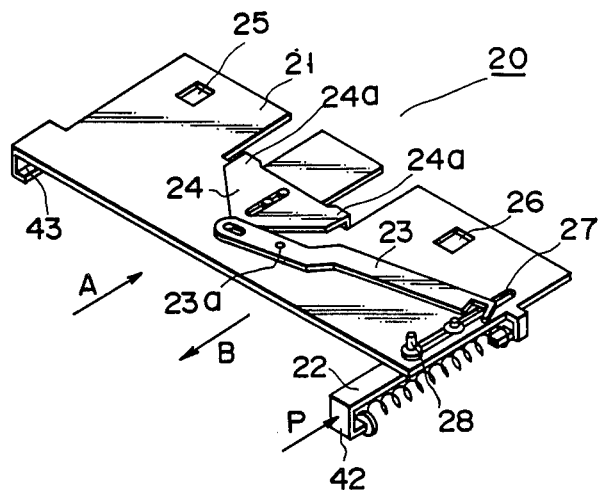
FIG. 4 is a perspective view of an ejector unit of the connector device of FIG. 1.

FIG. 4 shows ejector unit 20 which is mounted on header connector 10. Unit 20 includes base 21, push lever 22, and eject means, the push lever and the eject means being fitted on the base.

Base 21 is formed with cutout portions 25 and 26, corresponding in position to projections 14 and 15 of arm section 12 of header connector 10. Thus, as is shown in FIG. 1, ejector unit 20 can be fixed to the top face of header connector 10, in the following manner. First, unit 20 is fitted onto connector 10, in the same direction (arrow A) as the memory card, in a manner such that groove portion 43, at one side edge of base 21, engages arm section 11 of connector 10. Then, cutout portions 25 and 26 are caused to engage projections 14 and 15, respectively. The ejector unit can be removed from the header connector by disengaging the cutout portions from the projections.

Figure 5:
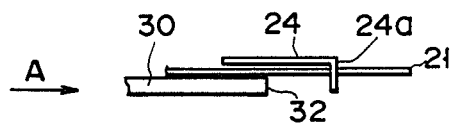
FIG. 5 is a vertical sectional view showing an eject lever and its surroundings.

The eject means of ejector unit 20 includes link 23, which is mounted on base 21 so as to be rotatable around pivot 23a, and eject lever 24 coupled to one end of link 23. Lever 24 can be slid along base 21, in the loading or unloading direction of the memory card, by rocking link 23. End portions 24a of lever 24 are bent downwardly, as is shown in FIG. 5, so that leading end face 32 of memory card 30 comes into contact with end portions 24a.

Figure 3:
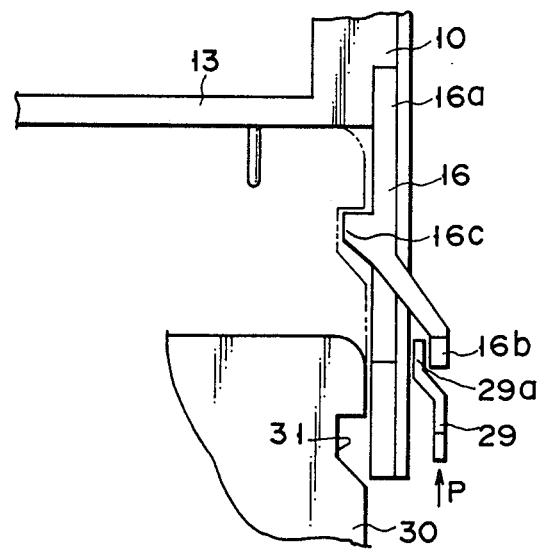
FIG. 3 is a sectional plan view showing a locking lever and an unlocking lever.
Figure 6:
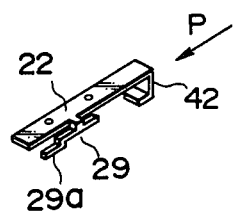
FIG. 6 is an extractive perspective view of the unlocking lever shown in FIG. 4.

As is shown in FIG. 4, push lever 22 of ejector unit 20 is located by means of guide pin 28, so as to be movable along cutout portion 27 on one side of base 21. As is shown extractively in FIG. 6, unlocking lever 29 is formed integrally on one edge of lever 22. If push lever 22 is pushed in, as indicated by arrow P in FIG. 4, distal end 29a of unlocking lever 29 engages end 16b of locking lever 16 of header connector 10, as is shown in FIG. 3. As push lever 22 is pushed in further, unlocking lever 29 presses locking lever 16 toward the outside of connector 10, thereby disengaging lever 16 from memory card 30.

FIG. 1 shows the connector apparatus having the aforementioned construction in the state where it is about to receive memory card 30. When card 30 is inserted into header connector 10, leading end face 32 of the card abuts against end portions 24a of eject lever 24. As card 30 is pushed in further, lever 24 moves in the card-loading direction. When card 30 is locked by the locking lever of the connector, after being inserted fully, distal end 23b of link 23 is situated somewhat short of the position where it touches guide pin 28 of push lever 22.

In ejecting memory card 30, guide pin 28 is moved by pushing front end portion 42 of push lever 22. Before pin 28 comes into contact with distal end 23b of link 23, card 30 is unlocked by the unlocking lever in the aforesaid manner. After the push lever is further pushed in to bring pin 28 into contact with link end 23b, link 23 rotates, so that eject lever 24 moves in the card-unloading direction. Thereupon, card 30 is ejected.

In this embodiment, spring 40 is interposed between front end portion 42 of push lever 22 and vertical piece 41, which protrudes downwardly from base 21. The spring continually urges lever 22 forward or in the direction indicated by arrow Q in FIG. 1. Immediately after memory card 30 is ejected by pushing in push lever 22, therefore, lever 22 is restored to the position of FIG. 1 by means of spring 40.

What is claimed is:

1. A connector apparatus comprising:

a header connector into which an IC pack is loaded and from which it is unloaded, and
    an ejector unit detachably mounted on the header connector,
    said header connector including a locking lever having a protrusion adapted to engage a locking notch in the surface of the IC pack, when the IC pack is loaded, and
    said ejector unit including a base to be attached to one surface of the header connector, a push lever attached to one side portion of the base, so as to be movable in the loading or unloading direction of the IC pack, an unlocking lever formed integrally on the push lever and adapted to engage the locking lever when the push lever moves in the pack-loading direction, and an eject member movably mounted on the base and having an eject portion adapted to move in the pack-unloading direction as the push lever moves in the pack-loading direction,
    wherein the push lever is moved in the pack-loading direction, so that the unlocking lever of said push lever causes the release of the locking lever of said header connector from the locking notch of the IC pack, then the eject portion of said eject member moves while pushing out the IC pack.

2. A connector apparatus according to claim 1, wherein said eject member of the ejector unit includes an eject lever, having an eject portion at its end, and a link having one end rotatably coupled to the eject lever, and the other end in contact with the push lever, said link being rotatably mounted on the unit base, at an intermediate point between the two ends of the link.

3. A connector apparatus according to claim 1, wherein said locking lever of the header connector is attached to one side edge of the header connector, and has a protrusion adapted to engage the locking notch of the IC pack, and an end portion, said protrusion projecting toward the IC pack, and said end portion projecting from the one side edge of the connector, in the direction opposite to the IC pack and being adapted to engage the unlocking lever of the ejector unit.

4. A connector apparatus according to claim 2, wherein said locking lever of the header connector is attached to one side edge of the header connector, and has a protrusion adapted to engage the locking notch of the IC pack, and an end portion, said protrusion projecting toward the IC pack, and said end portion projecting from the one side edge of the connector, in the direction opposite to the IC pack, and being adapted to engage the unlocking lever of the ejector unit.

* * * * *